United States Patent
Kartashev et al.

(10) Patent No.: US 9,379,308 B2
(45) Date of Patent: Jun. 28, 2016

(54) PIEZOELECTRIC COMPONENT

(75) Inventors: Igor Kartashev, Deutschlandsberg (AT); Peter Kraxner, Fernitz (AT); Markus Puff, Graz (AT)

(73) Assignee: EPCOS AG, München (DE)

( * ) Notice: Subject to any disclaimer, the term of this patent is extended or adjusted under 35 U.S.C. 154(b) by 452 days.

(21) Appl. No.: 13/878,509

(22) PCT Filed: Nov. 15, 2011

(86) PCT No.: PCT/EP2011/070141
§ 371 (c)(1),
(2), (4) Date: Jun. 18, 2013

(87) PCT Pub. No.: WO2012/065898
PCT Pub. Date: May 24, 2012

(65) Prior Publication Data
US 2013/0257227 A1     Oct. 3, 2013

(30) Foreign Application Priority Data
Nov. 15, 2010  (DE) .......................... 10 2010 051 444

(51) Int. Cl.
*H01L 41/107* (2006.01)
*H01L 41/047* (2006.01)

(52) U.S. Cl.
CPC .......... *H01L 41/107* (2013.01); *H01L 41/0471* (2013.01)

(58) Field of Classification Search
CPC ... H01L 41/044; H01L 41/107; H01L 41/047; H01L 41/083; H02N 2/18
USPC ...... 310/313 A, 313 B, 313 C, 313 D, 313 R, 310/318, 319, 365
See application file for complete search history.

(56) References Cited

U.S. PATENT DOCUMENTS 5,548,256 A * 8/1996 Watanabe et al. ............. 333/194
6,972,643 B2 * 12/2005 Tsunekawa .......... H03H 9/0028
310/313 D (Continued)

FOREIGN PATENT DOCUMENTS

DE    10 2006 049 873 A1    4/2008
DE    10 2006 050 064 A1    4/2008

(Continued)

OTHER PUBLICATIONS

Katsuno, M., et al., "Piezoelectric Transformer using Inter-digital Internal Electrodes," Proceedings of the IEEE Ultrasonics Symposium, vol. 1, Oct. 5-8, 1998, pp. 897-900.

*Primary Examiner* — Shawki S Ismail
*Assistant Examiner* — Bryan Gordon
(74) *Attorney, Agent, or Firm* — Slater Matsil, LLP

(57) ABSTRACT

A piezoelectric component comprises a parallelepipedal basic body made of piezoelectric material which has an input region and an output region at opposite longitudinal ends of the basic body. Furthermore, the piezoelectric component comprises first and second primary electrodes which are arranged inside the input region and first and second secondary electrodes which are arranged inside the output region. The primary electrodes are at a greater interval from longitudinal lateral faces of the basic body in a subregion which faces the output region than in the subregion which is remote from the output region. Likewise, the secondary electrodes are at a greater interval from the longitudinal lateral faces of the basic body in a subregion which faces the input region than in a subregion which is remote from the input region.

16 Claims, 3 Drawing Sheets

(56) References Cited

U.S. PATENT DOCUMENTS

| | | | |
|---|---|---|---|
| 7,564,173 B2 | 7/2009 | Namerikawa et al. | |
| 2003/0163908 A1* | 9/2003 | Kaji | H04R 17/00 29/25.35 |
| 2007/0194667 A1* | 8/2007 | Florian | H01L 41/107 310/359 |
| 2007/0267942 A1* | 11/2007 | Matsumoto | H03H 9/02228 310/313 A |
| 2009/0218916 A1* | 9/2009 | Florian | H01L 41/107 310/366 |
| 2009/0278424 A1* | 11/2009 | Florian | H01L 41/107 310/365 |

FOREIGN PATENT DOCUMENTS

| | | |
|---|---|---|
| EP | 1 158 586 A1 | 11/2001 |
| EP | WO 2006/015581 A2 | 2/2006 |
| JP | 6312505 A | 11/1994 |
| JP | 11266040 A | 9/1999 |
| JP | 2000-150978 A | 5/2000 |
| JP | 2000294851 A | 10/2000 |
| JP | 2002324923 A | 11/2002 |
| WO | 2008023686 A1 | 2/2008 |
| WO | WO 2010/110291 A | 9/2010 |

* cited by examiner

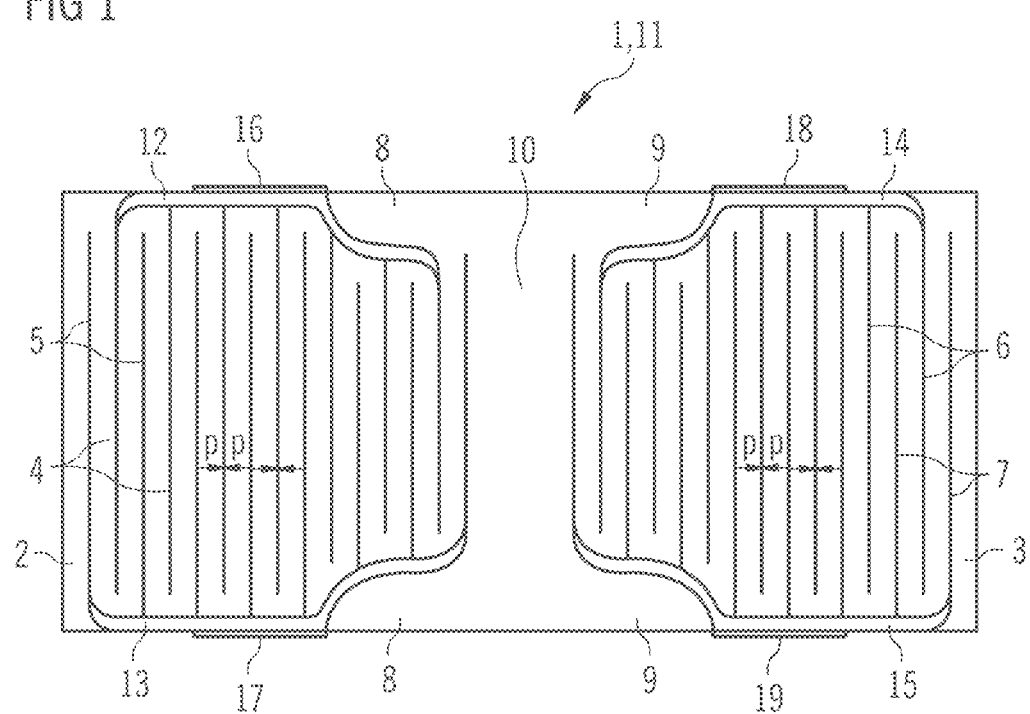

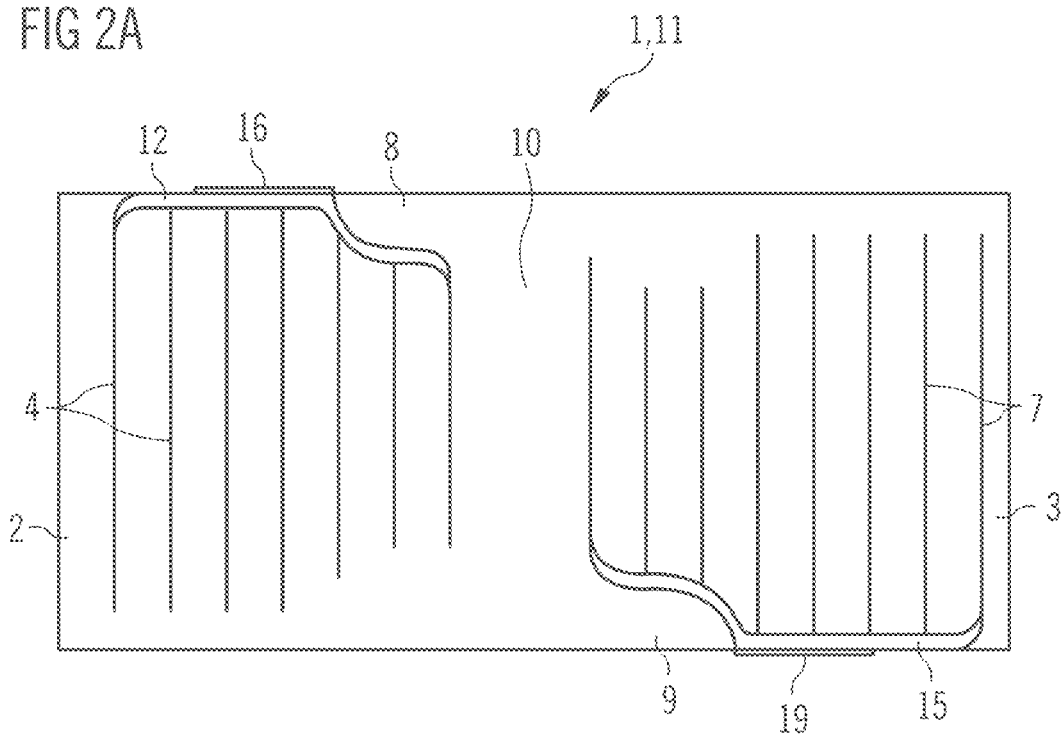
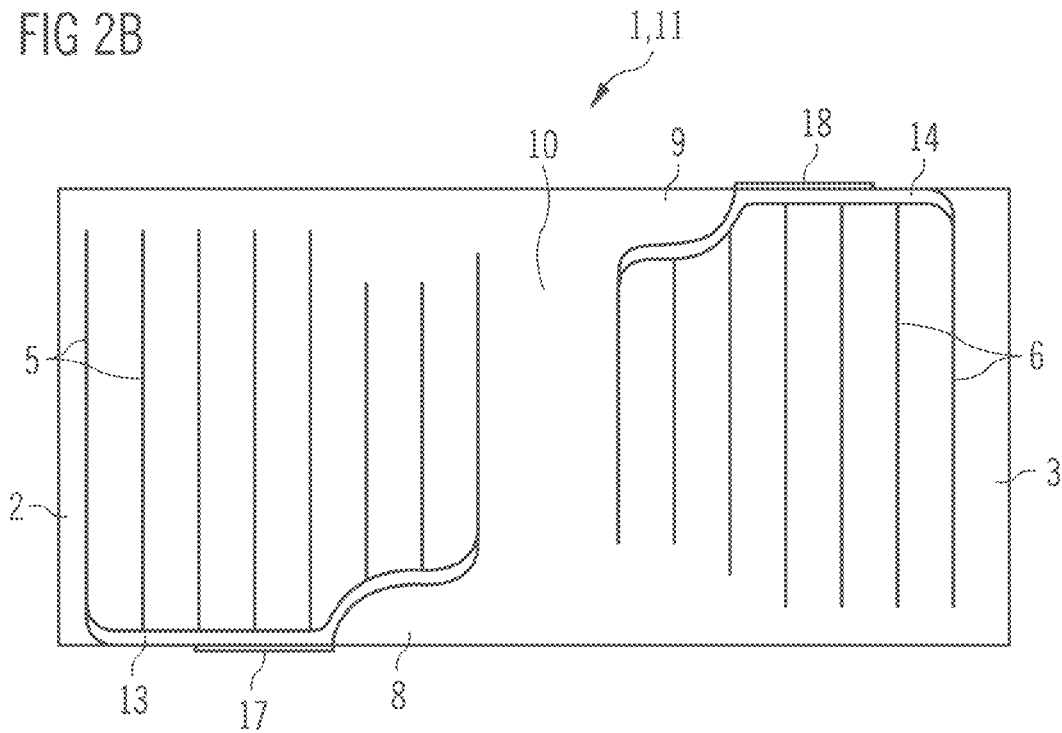

PIEZOELECTRIC COMPONENT

This patent application is a national phase filing under section 371 of PCT/EP2011/070141, filed Nov. 15, 2011, which claims the priority of German patent application 10 2010 051 444.6, filed Nov. 15, 2010, each of which is incorporated herein by reference in its entirety.

TECHNICAL FIELD

The invention relates to a piezoelectric component, in particular a transformer.

BACKGROUND

The efficiency of a piezoelectric component is dependent on the values of the mechanical quality factor $Q_m$ and of the coupling coefficient $K_{IJ}$. The coupling coefficient $K_{IJ}$ is a measure of the effectiveness of the conversion of electrical energy into mechanical energy, and vice versa. For many piezoelectric materials, the coupling coefficient K33 has the highest value. This corresponds to an arrangement in which the mechanical oscillations in the piezoelectric component are excited along the length of the piezoelectric base body. Furthermore, the electrodes are arranged at right angles with respect to the longitudinal direction of the piezoelectric base body. Moreover, the piezoelectric material is polarized in a longitudinal direction of the base body. In the majority of the already known variants of such a component, ceramic layers are arranged within the piezoelectric transformer parallel to the electrodes and are stacked one above another along the longitudinal direction of the piezoelectric base body. Therefore, the piezoelectric layers within the base body are likewise arranged at right angles with respect to the longitudinal direction of the base body. However, this so-called stack design of a piezoelectric transformer has some problems regarding production and electrical insulation between the input and output sides of the transformer. These transformers require a special sintering program in order to prevent possible detachment of the stack layers during the thermal treatment. If very good insulation between the input and output sides of the transformer is intended to be obtained, a special mechanical treatment after sintering is additionally required in order to ensure the exact dimensions of the piezoelectric component.

Another technology for the production of a piezoelectric transformer is described in "Piezoelectric Transformer Using Inter-Digital Internal Electrodes," Masafumi Katsuno, Yoshiaki Fuda, IEEE Ultrasonics Symposium 1998, pages 897 to 900. The production process is explained, in particular, on page 899. The piezoelectric component comprises a plurality of ceramic layers which are arranged in a longitudinal direction of the piezoelectric base body and which are stacked one above another perpendicular to the longitudinal direction of the base body. The electrodes are arranged in the interior of the piezoelectric base body on the surfaces of the layers. This structure of a piezoelectric transformer corresponds to the construction of a multilayer ceramic capacitor and can thus be produced according to the conventional methods. This production process has advantages, in particular, with regard to the detachment of the layers during the thermal treatment and compliance with the correct dimensions.

The electrodes arranged on the surfaces of the layers jointly form a plurality of vertical electrodes arranged at a right angle with respect to the longitudinal direction of the piezoelectric base body. One problem with this construction, however, is the relatively high probability of a voltage flashover between electrodes in the input region and output region of the transformer which are arranged on the same surface of a layer. This problem occurs particularly in the case of polarization and generally at high voltages between the electrodes in the input and output regions. However, if the insulating regions are accordingly enlarged, the efficiency of the piezoelectric transformer decreases.

Consequently, there is a need for a piezoelectric component which has high insulation and thus a high flashover voltage between an input region and an output region of the piezoelectric component and which, at the same time, has a high efficiency, particularly for low power ranges.

SUMMARY OF THE INVENTION

For this purpose, a piezoelectric component is proposed, which comprises a rectangular-parallelepipedal base body composed of piezoelectric material, first and second primary electrodes and first and second secondary electrodes. An input region and an output region are arranged at opposite longitudinal ends of the base body and are mechanically coupled to one another. Moreover, the rectangular-parallelepipedal base body has a multilayer structure. According to the invention, the primary electrodes arranged in the interior of the input region are at a greater distance from longitudinal side faces of the base body in a partial region facing the output region than in a partial region facing away from the output region. Furthermore, the secondary electrodes arranged in the interior of the output region are at a greater distance from the longitudinal side faces of the base body in a partial region facing the input region than in a partial region facing away from the input region.

By virtue of this special configuration of the primary and secondary electrodes, firstly, the flashover voltage can be significantly increased since larger insulating regions are situated between the input region and the output region of the piezoelectric component. Secondly, the efficiency of the piezoelectric component can likewise be increased since the primary and secondary electrodes, in partial regions situated at the respective longitudinal ends of the base body, extend over the entire width of the piezoelectric base body. Moreover, the piezoelectric component can be produced simply and cost-effectively since conventional multilayer technologies are used.

The piezoelectric component utilizes the direct and also the inverse piezoelectric effect.

When an AC voltage is applied to the first and second primary electrodes in the input region, the base body composed of piezoelectric material effects mechanical oscillations. Since the input region is mechanically coupled to the output region, these mechanical oscillations are transmitted to the output region. On account of the direct piezoelectric effect, an output voltage can then be tapped off in the output region at the first and second secondary electrodes.

In one embodiment, the piezoelectric component comprises primary insulating regions, which are arranged in the partial region of the input region which faces the output region, between the primary electrodes and the longitudinal side faces of the base body.

In one development, the piezoelectric component additionally has secondary insulating regions, which are arranged in the partial region of the output region which faces the input region, between the secondary electrodes and the longitudinal side faces of the base body. The primary and secondary insulating regions lead to additional insulation at the side faces of the piezoelectric base body and thus, increase the flashover voltage of the piezoelectric component.

In one embodiment, the primary electrodes closest to the output region are spaced apart from both longitudinal side faces of the base body. This can give rise to two primary insulating regions which are separated from one another and which are respectively arranged between the primary electrodes and the longitudinal side faces of the base body. Furthermore, it is possible for the secondary electrodes closest to the input region to be spaced apart from both longitudinal side faces of the base body, as a result of which two secondary insulating regions which are separated from one another and which are respectively arranged between the secondary electrodes and the longitudinal side faces of the base body can arise.

In one embodiment, an additional insulating region is arranged between the input region and the output region.

In a further embodiment, the primary electrodes closest to the output region are at a greater distance from the longitudinal side faces of the base body than the primary electrodes furthest away from the output region. Furthermore, the secondary electrodes closest to the input region can be at a greater distance from the longitudinal side faces of the base body than the secondary electrodes furthest away from the input region.

Furthermore, the piezoelectric component can be configured in such a way that the length of the primary electrodes decreases continuously from the input region in the direction of the output region. By way of example, the primary electrodes can each have a length that is less than or equal to the length of all those primary electrodes which are arranged closer to the input region.

Furthermore, the length of the respective secondary electrodes can decrease continuously from the output region in the direction of the input region. By way of example, the secondary electrodes can each have a length that is less than or equal to the length of all those secondary electrodes which are arranged closer to the output region.

In a further configuration, the multilayer structure of the piezoelectric component comprises a plurality of rectangular-parallelepipedal layers stacked one above another parallel to a top side of the base body. The primary and secondary electrodes can be arranged between the layers substantially perpendicular to the longitudinal side faces of the base body.

In one development, the closest electrodes of the input region and of the output region are situated on different layers. Preferably, the second primary electrodes and the second secondary electrodes which have the smallest spatial distance between the primary and secondary electrodes are in each case arranged on different layers. In this case, the term "spatial distance" preferably denotes the spatial distance parallel to the layers of the base body. Furthermore, it is possible for the first primary electrodes and the second primary electrodes which have the smallest spatial distance between the primary and secondary electrodes in each case to be arranged on different layers. The spatial distance between electrodes arranged on the same layer is thereby increased. This measure leads to improved insulation between the input and output regions of the piezoelectric component and thus to an increased breakdown voltage.

In one development, electrodes of the first primary electrodes and of the second secondary electrodes are arranged on a first layer and electrodes of the second primary electrodes and of the first secondary electrodes are arranged on a second layer.

In a further embodiment, the piezoelectric component comprises a first additional primary electrode and a second additional primary electrode, which are situated in the interior of the input region. In this case, the first additional primary electrode is electrically coupled to the first primary electrodes and the second additional primary electrode is electrically coupled to the second primary electrodes. The first and second primary electrodes can intertwine in a comb-like manner.

In one development, the piezoelectric component has a first and a second additional secondary electrode in the interior of the output region. The first additional secondary electrode is electrically coupled to the first secondary electrodes and the second additional secondary electrode is electrically coupled to the second secondary electrodes. The first and second secondary electrodes can intertwine in a comb-like manner.

In one development, the piezoelectric component comprises a first and a second outer primary electrode which are, in each case, electrically coupled to the first and second additional primary electrodes, respectively, and which are arranged on opposite longitudinal side faces of the base body.

Furthermore, the piezoelectric component can have a first and a second outer secondary electrode which are, in each case, electrically coupled to the first and second additional secondary electrodes, respectively, and which are arranged on opposite longitudinal side faces of the base body. As a result of the special shaping of the additional primary and secondary electrodes, the outer primary and secondary electrodes can be positioned at a greater spatial distance from one another. This additionally increases the value of the flashover voltage of the piezoelectric component.

In one development of the piezoelectric component, additional insulating layers are applied on the top side and an underside of the base body. This feature improves the insulation with respect to the top side and the underside of the base body and thus, increases the flashover voltage of the piezoelectric component.

In a further embodiment, the piezoelectric material of the base body is polarized in a longitudinal direction of the base body. Adjacent sections of the piezoelectric material between the first and second primary and/or secondary electrodes are polarized in an oppositely directed fashion.

Another aspect of the invention relates to a method for operating a piezoelectric component according to at least one of the exemplary embodiments described above.

In this method, the piezoelectric component is excited to oscillate along the longitudinal direction of the base body. The frequency of this oscillation corresponds to a harmonic oscillation relative to the fundamental oscillation of the base body. Moreover, the frequency is chosen such that nodes of the harmonic oscillation arise at positions at which the first and second outer primary and/or secondary electrodes are arranged. This ensures that no mechanical energy is lost and the mechanical energy can thus be converted into electrical energy very efficiently.

BRIEF DESCRIPTION OF THE DRAWINGS

The invention is explained in greater detail below on the basis of a plurality of exemplary embodiments with reference to the figures. Elements that are functionally identical or identical in terms of their effect bear identical reference signs. Insofar as elements correspond to one another in terms of their function, the description thereof is not repeated in each of the following figures.

FIG. 1 shows a layer of a first embodiment of the piezoelectric component;

FIG. 2A shows a first layer of a second embodiment of the piezoelectric component;

FIG. 2B shows a second layer of the second embodiment of the piezoelectric component;

Figure 3A:
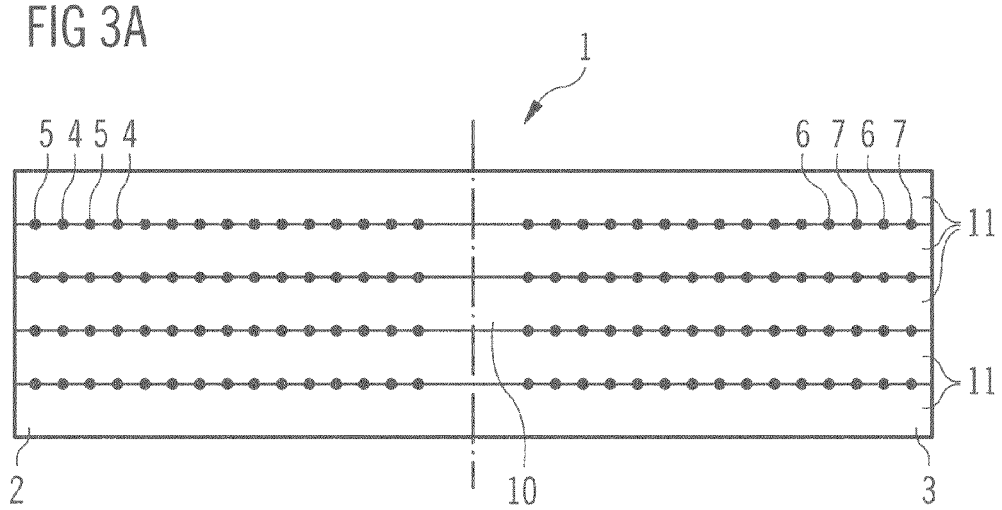
FIG. 3A shows a cross section of the first embodiment of the piezoelectric component.

The individual exemplary embodiments are illustrated schematically in the figures, individual elements being omitted for reasons of clarity. Furthermore, individual elements may be shown larger or highlighted relative to other elements in order to afford a better understanding or for illustrative purposes. It goes without saying that a person skilled in the art can combine individual aspects from the configurations with one another or supplement them. In particular, the different positions and configurations of the electrodes in the input region and output region of the piezoelectric base body can be combined with one another.

DETAILED DESCRIPTION OF ILLUSTRATIVE EMBODIMENTS

FIG. 1 shows a piezoelectric transformer that operates with longitudinal oscillations and comprises a base body 1 in a longitudinal section parallel to a top side of the piezoelectric base body 1. The rectangular-parallelepipedal base body 1 composed of piezoelectric material comprises an input region 2 and an output region 3, which are situated at opposite longitudinal ends of the base body 1. The input region 2 is mechanically coupled to the output region 3. The rectangular-parallelepipedal base body 1 has a multilayer structure comprising a plurality of rectangular-parallelepipedal layers 11 stacked one above another parallel to the top side of the base body 1. The top side of the base body 1 is defined by means of one of the largest surface sections of the rectangular-parallelepipedal base body 1.

Furthermore, the piezoelectric component comprises first and second primary electrodes 4, 5 in the interior of the input region 2 and first and second secondary electrodes 6, 7 in the interior of the output region 3, which are arranged in the multilayer structure. In this case, the primary and secondary electrodes 4, 5, 6, 7 are arranged between the layers 11 substantially perpendicular to the longitudinal side faces of the base body 1. The primary and secondary electrodes 4, 5, 6, 7 respectively arranged vertically one above another form vertical electrodes oriented substantially perpendicular to the longitudinal direction of the piezoelectric base body 1.

According to the invention, the primary electrodes 4, 5 are at a greater distance from longitudinal side faces of the base body 1 in a partial region facing the output region 3 than in a partial region facing away from the output region 3. In particular, the primary electrodes 4, 5 closest to the output region 3 are at a greater distance from the longitudinal side faces of the base body 1 than the primary electrodes 4, 5 furthest away from the output region 3. The secondary electrodes 6, 7, too, are at a greater distance from the longitudinal side faces of the base body 1 in a partial region facing the input region 2 than in a partial region facing away from the input region 2. In this case, the secondary electrodes 6, 7 closest to the input region 2 are at a greater distance from the longitudinal side faces of the base body 1 than the secondary electrodes 6, 7 furthest away from the input region 2. As a result, primary insulating regions 8 are formed, which are arranged in the partial region of the input region 2 which faces the output region 3, between the primary electrodes 4, 5 and the longitudinal side faces of the base body 1. Moreover, secondary insulating regions 9 are situated between the secondary electrodes 6, 7 and the longitudinal side faces of the base body 1 in the partial region of the output region 3 which faces the input region 2. An additional insulating region 10 is formed between the input region 2 and the output region 3.

Furthermore, the piezoelectric component comprises a first additional primary electrode 12, which is electrically coupled to the first primary electrodes 4, and a second additional primary electrode 13, which is electrically coupled to the second primary electrodes 5. The first and second additional primary electrodes are arranged partly in the interior of the input region 2.

Moreover, the piezoelectric component comprises a first additional secondary electrode 14, which is electrically coupled to the first secondary electrodes 6, and a second additional secondary electrode 15, which is electrically coupled to the second secondary electrodes 7. The first additional secondary electrode 14 and the second additional secondary electrode 15 are situated partly in the interior of the output region 3.

The first and second primary electrodes 4, 5 and the first and second secondary electrodes 6, 7 intertwine in a comb-like manner.

In addition, the piezoelectric component comprises a first outer primary electrode 16, which is electrically coupled to the first additional primary electrode 12, a second outer primary electrode 17, which is electrically coupled to the second additional primary electrode 13, a first outer secondary electrode 18, which is electrically connected to the first additional secondary electrode 14, and a second outer secondary electrode 19, which is electrically connected to the second additional secondary electrode 15. The first and second outer primary electrodes 16, 17 and the first and second outer secondary electrodes 18, 19 are arranged on the longitudinal side faces of the base body 1.

The piezoelectric material of the component is polarized in a longitudinal direction of the base body 1, wherein the polarization of adjacent sections between the first and secondary primary and/or secondary electrodes 4, 5, 6, 7 is directed oppositely.

In an embodiment which is not shown, additional insulating layers can be applied on the top side and an underside of the base body 1.

When an AC voltage is applied to the first and second outer primary electrodes 16, 17, a longitudinal oscillation forms as a result of the inverse piezoelectric effect in the piezoelectric base body 1. On account of the first and second primary electrodes 4, 5 being connected in parallel by the first and second additional primary electrodes 12, 13, a high efficiency in the conversion of an electrical energy into a mechanical energy is obtained. Since the first and second primary electrodes 4, 5, starting from a position of the outer primary electrodes 16, 17 as far as the longitudinal end of the base body 1, utilize the full width of the piezoelectric base body 1, the efficiency of the piezoelectric component is additionally increased.

The generated longitudinal oscillation of the piezoelectric base body 1 is transmitted to the output region 3 on account of the mechanical coupling. Owing to the direct piezoelectric effect, an output voltage is generated between the first and second outer secondary electrodes 18, 19. In the output region 3, too, the efficiency of the piezoelectric component is increased by the parallel-connected first and second secondary electrodes and by the utilization of the entire available width of the piezoelectric base body 1.

The value of the flashover voltage is determined by distance between the outer primary and secondary electrodes 16, 17, 18, 19 and by the insulating regions 8, 9, 10 formed therebetween. For some applications, for example, in the domestic power supply sector, the flashover voltage is defined by means of technical standards that also limit the distance between the outer electrodes to 6 mm, for example. As a result, transformers that operate at a low power level require the same insulating regions as transformers that operate at a high power level. However, larger insulating regions lead to a decreasing efficiency of the piezoelectric transformer.

For this reason, the specially shaped primary insulating regions 8 and secondary insulating regions 9 are formed in the exemplary embodiment concerning FIG. 1. These ensure good insulation between the primary electrodes 4, 5 in the input region 2 and the secondary electrodes 6, 7 in the output region 3. Since the outer primary electrodes 16, 17 and the outer secondary electrodes 18, 19 then have a larger spatial distance, the value of the flashover voltage also increases. Despite the primary and secondary insulating regions 8, 9, a high efficiency of the piezoelectric component can be ensured since the primary and secondary electrodes 4, 5, 6, 7 starting from a position of the outer primary and secondary electrodes 16, 17, 18, 19 as far as the respective longitudinal ends of the piezoelectric base body 1 utilize the full width of the piezoelectric base body 1. The dimensions of the primary and secondary insulating regions 8, 9 are determined by the value of the flashover voltage required by the piezoelectric transformer.

FIGS. 2A and 2B show a second embodiment of the piezoelectric component and illustrate an arrangement of electrodes in two adjoining layers 11. FIG. 2A shows that electrodes of the first primary electrodes 4 and of the second secondary electrodes 7 are arranged on a first layer 11. Furthermore, FIG. 2B illustrates that the electrodes of the second primary electrodes 5 and of the first secondary electrodes 6 are arranged on a second layer 11, which is arranged directly adjacent to the first layer 11. On account of this special arrangement, those electrodes which have the smallest spatial distance between the primary and secondary electrodes 4, 5, 6, 7, namely the second primary electrodes 5 and the second secondary electrodes 7, are situated on respectively different layers 11. Therefore, the second primary electrodes 5 and the second secondary electrodes 7 are additionally separated from one another by the thickness of a layer 11. With the aid of this measure, the value of the flashover voltage of the piezoelectric component can be increased further. The thickness of a layer usually varies in a range of 10 to 50 µm and is dependent on the distance of the primary and secondary electrodes 4, 5, 6, 7.

Figure 3B:
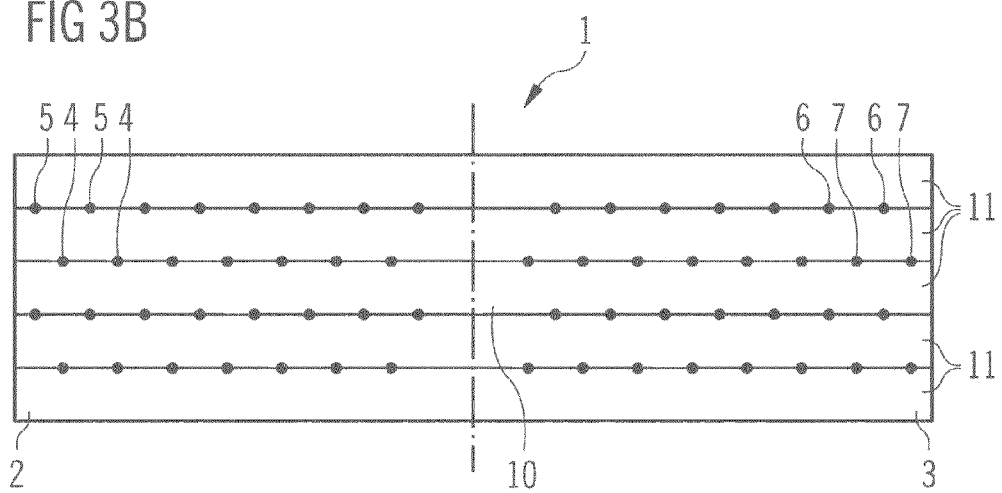
FIG. 3B shows a cross section of the second embodiment of the piezoelectric component.

FIG. 3A shows a cross section of the first embodiment of the piezoelectric component parallel to a side face of the piezoelectric base body. FIG. 3B shows the same view of the piezoelectric component for the second embodiment. As can be seen from a comparison of FIG. 3A and FIG. 3B, the spatial distance between the primary electrodes 4, 5 and the secondary electrodes 6, 7 increases in the second embodiment of the piezoelectric component. The thickness of a layer 11 is additionally situated between the second primary electrodes 5 and the second secondary electrodes 7.

In the specified method, when an AC voltage is applied to the outer primary electrodes 16, 17, the piezoelectric component is excited to oscillate along the longitudinal direction of the base body 1. The frequency of this oscillation corresponds to a harmonic oscillation relative to the fundamental oscillation of the base body 1. The frequency is chosen such that nodes of the harmonic oscillation arise at positions at which the first and second outer primary and/or secondary electrodes 16, 17, 18, 19 are arranged. By virtue of this choice of frequency, the outer primary and/or secondary electrodes 16, 17, 18, 19 do not adversely influence the propagation of the mechanical oscillation. Therefore, the electrical energy can be converted very efficiently into a mechanical energy (and vice versa). The efficiency of the piezoelectric component is additionally increased as a result.

The invention claimed is:

1. A piezoelectric component comprising:
    a rectangular-parallelepipedal base body composed of a piezoelectric material, the base body having an input region and an output region arranged at opposite longitudinal ends of the base body, wherein the input region is mechanically coupled to the output region, and wherein the base body has a multilayer structure;
    first primary electrodes arranged in an interior of the input region in the multilayer structure;
    second primary electrodes arranged in the interior of the input region in the multilayer structure;
    first secondary electrodes arranged in an interior of the output region in the multilayer structure; and
    second secondary electrodes arranged in the interior of the output region in the multilayer structure,
    wherein the first primary electrodes and the second primary electrodes are at a greater distance from longitudinal side faces of the base body in a partial region facing the output region than in a partial region facing away from the output region, and
    wherein the first secondary electrodes and the second secondary electrodes are at a greater distance from the longitudinal side faces of the base body in the partial region facing the input region than in the partial region facing away from the input region.

2. The piezoelectric component according to claim 1, wherein the first primary electrodes and the second primary electrodes closest to the output region are at a greater distance from the longitudinal side faces of the base body than the first primary electrodes and the second primary electrodes furthest away from the output region.

3. The piezoelectric component according to claim 1, wherein the first secondary electrodes and the second secondary electrodes closest to the input region are at a greater distance from the longitudinal side faces of the base body than the first secondary electrodes and the second secondary electrodes furthest away from the input region.

4. The piezoelectric component according to claim 1, wherein a length of the first primary electrodes and the second primary electrodes decreases continuously from the input region in a direction of the output region.

5. The piezoelectric component according to claim 1, wherein a length of the first secondary electrodes and the second secondary electrodes decreases continuously from the output region in a direction of the input region.

6. The piezoelectric component according to claim 1, further comprising at least one of primary insulating regions, secondary insulating regions and an additional insulating region,
    wherein the primary insulating regions are arranged in the partial region of the input region which faces the output region between the first and second primary electrodes and the longitudinal side faces of the base body,
    wherein the secondary insulating regions are arranged in the partial region of the output region which faces the input region between the first and second secondary electrodes and the longitudinal side faces of the base body, and
    wherein the additional insulating region is formed between the input region and the output region.

7. The piezoelectric component according to claim 1, wherein the multilayer structure comprises a plurality of rectangular-parallelepipedal layers stacked one above another parallel to a top side of the base body, wherein the top side of the base body is defined by one of a largest surface sections of the base body, and wherein the first primary electrodes, the second primary electrodes, the first secondary electrodes, and the second secondary electrodes are arranged between the layers substantially perpendicular to the longitudinal side faces of the base body.

8. The piezoelectric component according to claim 1, wherein the second primary electrodes and the second secondary electrodes are each arranged on different layers such that electrodes of the second primary electrodes and the second secondary electrodes have a smallest spatial distance between the first primary electrodes and the second primary electrodes, and the first secondary electrodes and the second secondary electrodes.

9. The piezoelectric component according to claim 1, wherein electrodes of the first primary electrodes and the second secondary electrodes are arranged on a first layer of the multilayer structure and electrodes of the second primary electrodes and the first secondary electrodes are arranged on a second layer of the multilayer structure.

10. The piezoelectric component according to claim 1, further comprising:
    a first additional primary electrode arranged at least partly in the interior of the input region, wherein the first additional primary electrode is configured to be electrically coupled to the first primary electrodes; and
    a second additional primary electrode arranged at least partly in the interior of the input region, wherein the second additional primary electrode is configured to be electrically coupled to the second primary electrodes such that the first primary electrodes and the second primary electrodes intertwine in a comb-like manner.

11. The piezoelectric component according to claim 1, further comprising:
    a first additional secondary electrode arranged at least partly in the interior of the output region, wherein the first additional secondary electrode is configured to be electrically coupled to the first secondary electrodes; and
    a second additional secondary electrode arranged at least partly in the interior of the output region, wherein the second additional secondary electrode is configured to be electrically coupled to the second secondary electrodes such that the first secondary electrodes and the second secondary electrodes intertwine in a comb-like manner.

12. The piezoelectric component according to claim 1, further comprising at least one of a first outer primary electrode, a second outer primary electrode, a first outer secondary electrode, and a second outer secondary electrode,
    wherein the first outer primary electrode is arranged on one of the longitudinal side faces of the base body and is configured to be electrically coupled to a first additional primary electrode,
    wherein the second outer primary electrode is arranged on another of the longitudinal side faces of the base body and is configured to be electrically coupled to a second additional primary electrode,
    wherein the first outer secondary electrode is arranged on one of the longitudinal side faces of the base body and is configured to be electrically coupled to a first additional secondary electrode, and
    wherein the second outer secondary electrode is arranged on another of the longitudinal side faces and is configured to be electrically coupled to a second additional secondary electrode.

13. The piezoelectric component according to claim 1, wherein additional insulating layers are applied on a top side and an underside of the base body.

14. The piezoelectric component according to claim 1, wherein the piezoelectric material is polarized in a longitudinal direction of the base body such that a polarization of the piezoelectric material of adjacent sections between at least two of the first primary electrodes, the second primary electrodes, the first secondary electrodes, and the second secondary electrodes is directed oppositely.

15. A transformer comprising:
    a rectangular-parallelepipedal base body composed of piezoelectric material the base body having an input region and an output region arranged at opposite longitudinal ends of the base body, wherein the input region is mechanically coupled to the output region, and wherein the base body has a multilayer structure;
    first primary electrodes arranged in an interior of the input region in the multilayer structure;
    second primary electrodes arranged in the interior of the input region in the multilayer structure;
    first secondary electrodes arranged in an interior of the output region in the multilayer structure; and
    second secondary electrodes arranged in the interior of the output region in the multilayer structure,
    wherein the first primary electrodes and the second primary electrodes are at a greater distance from longitudinal side faces of the base body in a partial region facing the output region than in a partial region facing away from the output region, and
    wherein the first secondary electrodes and the second secondary electrodes are at a greater distance from the longitudinal side faces of the base body in the partial region facing the input region than in the partial region facing away from the input region.

16. A method for operating a piezoelectric component, the method comprising:
    providing the piezoelectric component including a rectangular-parallelepipedal base body composed of piezoelectric material having an input region and an output region arranged at opposite longitudinal ends of the base body, first primary electrodes arranged in an interior of the input region, second primary electrodes arranged in the interior of the input region, first secondary electrodes arranged in an interior of the output region, and second secondary electrodes arranged in the interior of the output region;
    choosing a frequency for operation of the piezoelectric component corresponding to a harmonic oscillation relative to a fundamental oscillation of the base body, wherein the frequency is chosen such that nodes of the harmonic oscillation arise at positions at which at least one of the first primary electrodes, the second primary electrodes, the first secondary electrodes, and the second secondary electrodes are arranged; and
    exciting the piezoelectric component to oscillate along a longitudinal direction of a base body, wherein the piezoelectric component is operated at the chosen frequency,
    wherein the first primary electrodes and the second primary electrodes are at a greater distance from longitudinal side faces of the base body in a partial region facing the output region than in a partial region facing away from the output region, and wherein the first secondary electrodes and the second secondary electrodes are at a greater distance from the longitudinal side faces of the base body in the partial region facing the input region than in the partial region facing away from the input region.

* * * * *